United States Patent
El-Essawy et al.

(10) Patent No.: US 10,067,523 B2
(45) Date of Patent: Sep. 4, 2018

(54) DATA CENTER POWER CONVERSION EFFICIENCY MANAGEMENT

(71) Applicant: International Business Machines Corporation, Armonk, NY (US)

(72) Inventors: Wael R. El-Essawy, Austin, TX (US); Karthick Rajamani, Austin, TX (US); Juan C. Rubio, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 651 days.

(21) Appl. No.: 14/175,510

(22) Filed: Feb. 7, 2014

(65) Prior Publication Data

US 2014/0156100 A1    Jun. 5, 2014

Related U.S. Application Data

(62) Division of application No. 12/878,063, filed on Sep. 9, 2010, now Pat. No. 8,688,394.

(51) Int. Cl.
*G05F 1/66* (2006.01)
*G06F 1/26* (2006.01)
*H05K 7/14* (2006.01)
*H04L 29/08* (2006.01)

(52) U.S. Cl.
CPC .............. *G05F 1/66* (2013.01); *G06F 1/26* (2013.01); *H04L 67/12* (2013.01); *H05K 7/1492* (2013.01); *H05K 7/1498* (2013.01)

(58) Field of Classification Search
CPC .................................................. H05K 7/1498
USPC .......................................................... 700/296
See application file for complete search history.

(56) References Cited

U.S. PATENT DOCUMENTS

| 5,972,417 | A | 10/1999 | Perkins et al. |
| 7,333,916 | B2 | 2/2008 | Warfield et al. |
| 7,730,365 | B1 | 6/2010 | Belady |
| 2005/0138438 | A1 | 6/2005 | Bodas |
| 2007/0041387 | A1* | 2/2007 | Ghoshal ............. H04L 12/10 370/395.52 |
| 2008/0320322 | A1* | 12/2008 | Green ................. G06F 1/26 713/340 |

(Continued)

OTHER PUBLICATIONS

Loeffeler, "10 Ways to Save Energy in Your Data Center" Buildings; May 2008, vol. 102 Issue 5, p. 64.*

*Primary Examiner* — Emilio J Saavedra
(74) *Attorney, Agent, or Firm* — Mercedes Hobson; Robert C Rolnik; William Stock (57) ABSTRACT

A data center energy management (DCEM) server configures a power supply in the data center. The DCEM server sums input alternating current (AC) power of the power supply to a total AC power of the data center, wherein the total AC power of the data center is a sum of AC power of a plurality of power supplies. The DCEM server sums output direct current (DC) power of the power supply to a total DC power of the data center and reports a ratio of total AC power to total DC power as data center power conversion efficiency. The DCEM server sets a preset power supply efficiency threshold. The DCEM server determines that a real-time power efficiency level is below the power supply efficiency threshold. The DCEM server, responsive to a determination that real-time power efficiency level is below the power supply efficiency threshold, may remedy the power supply.

3 Claims, 8 Drawing Sheets

(56) References Cited

U.S. PATENT DOCUMENTS

| | | | |
|---|---|---|---|
| 2009/0089604 A1* | 4/2009 | Malik | G06F 1/28 |
| | | | 713/340 |
| 2009/0106571 A1 | 4/2009 | Low et al. | |
| 2009/0187445 A1 | 7/2009 | Barclay et al. | |
| 2009/0198460 A1* | 8/2009 | Carroll | G01R 19/2513 |
| | | | 702/60 |
| 2009/0217060 A1* | 8/2009 | Tsuchiya | G06F 1/3203 |
| | | | 713/300 |
| 2009/0222241 A1 | 9/2009 | Dorogi et al. | |
| 2009/0231152 A1* | 9/2009 | Tung | G06F 1/206 |
| | | | 340/660 |
| 2009/0234512 A1 | 9/2009 | Ewing | |
| 2009/0256422 A1 | 10/2009 | Fox et al. | |
| 2009/0328055 A1 | 12/2009 | Bose | |
| 2010/0058092 A1 | 3/2010 | Bougaev et al. | |
| 2010/0064151 A1 | 3/2010 | Saeki | |
| 2010/0070219 A1 | 3/2010 | Azancot et al. | |
| 2010/0100250 A1 | 4/2010 | Budhraja et al. | |
| 2012/0021708 A1* | 1/2012 | Murji | H03G 3/3042 |
| | | | 455/115.4 |

* cited by examiner

| | WARNING MATRIX TEMP = 80 F | | | 340 |
|---|---|---|---|---|
| LOAD | | 20% | 50% | 100% |
| EFFICIENCY | | 77% | 80% | 77% |

343

| | WARNING MATRIX TEMP = 100 F | | | 350 |
|---|---|---|---|---|
| LOAD | | 20% | 50% | 100% |
| EFFICIENCY | | 75% | 77% | 75% |

| | ALARM MATRIX TEMP = 80 F | | | 360 |
|---|---|---|---|---|
| LOAD | | 20% | 50% | 100% |
| EFFICIENCY | | 72% | 75% | 72% |

| | ALARM MATRIX TEMP = 100 F | | | 370 |
|---|---|---|---|---|
| LOAD | | 20% | 50% | 100% |
| EFFICIENCY | | 70% | 72% | 70% |

DATA CENTER POWER CONVERSION EFFICIENCY MANAGEMENT

This application claims benefit of priority of patent application Ser. No. 12/878,063, filed on Sep. 9, 2010, which is herein incorporated by reference.

BACKGROUND

The present invention relates generally to a computer implemented method, data processing system, and computer program product for monitoring, measurement, and management of the efficiency of electrical power delivery systems. More specifically, the present invention relates to detecting degradation in power supplies in a data center and proactively removing degraded power supplies from service or otherwise modifying power delivery or system loads to enhance productive use of electricity.

There are over 1.5 billion power supplies used to convert alternating current (AC) into direct current (DC) useful for devices such as televisions, cellular phones, and computers. Approximately 11% of electricity in the U.S. flows through power supplies. Most power supplies are between 20-90% efficient in converting AC to DC. In addition to wasting electricity, an inefficient power supply can produce unwanted heat. In a data center with a high density of information technology (IT) equipment, removing this extra heat results in additional cost on top of the increased IT electricity consumption due to power conversion inefficiency.

Many factors may impact efficiency of power supplies. Contamination and component wear can reduce efficiency during the life of a power supply. In addition, dust and humidity may clog a power supply's cooling fans. Dust collected on the power supply's heat sink surface reduces its efficiency in removing heat. This gradual deterioration in the power supply's fan and heat sink performance results in raising the temperature of the power supply, which leads to reducing the power supply efficiency. In addition, surges and voltage variations in the AC arriving from the mains (i.e. the chief power lines entering a data center) also limit the efficiency of a power supply. All these reasons add uncertainty to the actual run-time power supply efficiency. Eventually, degradation of a power supply can lead to its failure and disruption of the IT equipment operation. Without monitoring the actual power supply efficiency at run time, there is no way to detect its efficiency deterioration, predict failure, or, in some cases, even discover its failure.

Accordingly, a remedy to the situation is warranted.

BRIEF SUMMARY

The present invention provides a computer implemented method, data processing system and computer program product for managing a plurality of power supplies in a data center. A data center energy management (DCEM) server configures a power supply in the data center. The DCEM server sums input alternating current (AC) power of the power supply to a total AC power of the data center, wherein the total AC power of the data center is a sum of input AC power of a plurality of power supplies. The DCEM server sums output direct current (DC) power of the power supply to a total DC power of the data center and reports a ratio of total AC power to total DC power as data center power conversion efficiency (DCPCE). The DCEM server sets a preset power supply efficiency threshold. The DCEM server determines that a real-time power efficiency level is below the power supply efficiency threshold. The DCEM server, responsive to a determination that real-time power efficiency level is below the power supply efficiency threshold, may remedy the power supply. Remedy of the low efficiency power supplies in the data center improves the DCPCE, and hence reduces wasted energy in power supplies, and improves the overall data center energy efficiency.

BRIEF DESCRIPTION OF THE SEVERAL VIEWS OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION

Figure 1A:
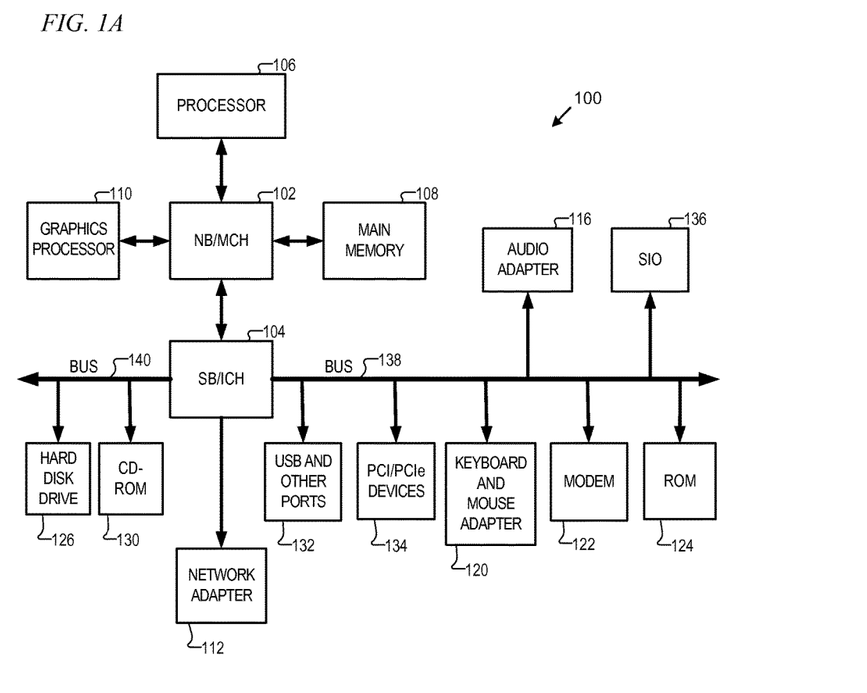
FIG. 1A is a block diagram of a data processing system in accordance with an illustrative embodiment of the invention.

With reference now to the figures and in particular with reference to FIG. 1A, a block diagram of a data processing system is shown in which aspects of an illustrative embodiment may be implemented. Data processing system 100 is an example of a computer, in which code or instructions implementing the processes of the present invention may be located. In the depicted example, data processing system 100 employs a hub architecture including a north bridge and memory controller hub (NB/MCH) 102 and a south bridge and input/output (I/O) controller hub (SB/ICH) 104. Processor 106, main memory 108, and graphics processor 110 connect to north bridge and memory controller hub 102. Graphics processor 110 may connect to the NB/MCH through an accelerated graphics port (AGP), for example.

In the depicted example, local area network (LAN) adapter 112 connects to south bridge and I/O controller hub 104 and audio adapter 116, keyboard and mouse adapter 120, modem 122, read only memory (ROM) 124, hard disk drive (HDD) 126, CD-ROM drive 130, universal serial bus (USB) ports and other communications ports 132, and PCI/PCIe devices 134 connect to south bridge and I/O controller hub 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS). Hard disk drive 126 and CD-ROM drive 130 may use, for example, an integrated drive electronics (IDE) or serial advanced technology attachment (SATA) interface. A super I/O (SIO) device 136 may be connected to south bridge and I/O controller hub 104.

An operating system runs on processor 106 to coordinate and provide control of various components within data processing system 100 in FIG. 1A. The operating system may be a commercially available operating system such as Microsoft® Windows® XP. Microsoft and Windows are trademarks of Microsoft Corporation in the United States, other countries, or both. An object oriented programming system, such as the Java™ programming system, may run in conjunction with the operating system and provides calls to the operating system from Java™ programs or applications executing on data processing system 100. Java™ is a trademark of Sun Microsystems, Inc. in the United States, other countries, or both.

Instructions for the operating system, the object-oriented programming system, and applications or programs are located on storage devices, such as hard disk drive 126, and may be loaded into main memory 108 for execution by processor 106. The processes of the present invention can be performed by processor 106 using computer implemented instructions, which may be located in a memory such as, main memory 108, read only memory 124, or in one or more peripheral devices.

Those of ordinary skill in the art will appreciate that the hardware in FIG. 1A may vary depending on the implementation. Other internal hardware or peripheral devices, such as flash memory, equivalent non-volatile memory, and the like, may be used in addition to, or in place of, the hardware depicted in FIG. 1A. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus, and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, main memory 108 or a cache such as found in north bridge and memory controller hub 102. A processing unit may include one or more processors or CPUs. The depicted example in FIG. 1A is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, aspects of the present invention may be embodied as a system, method, or computer program product. Accordingly, aspects of the present invention may take the form of an entirely hardware embodiment, an entirely software embodiment (including firmware, resident software, micro-code, etc.), or an embodiment combining software and hardware aspects that may all generally be referred to herein as a "circuit," "module" or "system." Furthermore, aspects of the present invention may take the form of a computer program product embodied in one or more computer readable storage devices(s) having computer readable program code embodied thereon.

Any combination of one or more computer readable storage device(s) may be utilized. A computer readable storage device may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage device would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage device may be any tangible device that can store a program for use by or in connection with an instruction execution system, apparatus, or device. The term "computer-readable storage device" does not encompass a signal propagation media such as a copper cable, optical fiber or wireless transmission media.

Computer program code for carrying out operations for aspects of the present invention may be written in any combination of one or more programming languages, including an object oriented programming language such as Java, Smalltalk, C++ or the like, and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable storage device that can direct a computer, other programmable data processing apparatus, or other devices to function in a particular manner, such that the instructions stored in the computer readable storage device produce an article of manufacture including instructions which implement the function/act specified in the flowchart and/or block diagram block or blocks.

The computer program instructions may also be loaded onto a microcontroller, a service processor, or other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As the power supply unit (PSU) power conversion efficiency deteriorates over time because of aging and environmental parameters (for example humidity, contamination particles, and temperature), PSU efficiency can be monitored over time. Upstream devices may collect information from the PSUs, such as input power and output power of one or more PSUs. Monitoring the power supply efficiency of an individual PSU, is performed by an energy management supervisor (EMS). The EMS monitors individual power supplies, or a small number of power supplies, plus the power supplies input, generally AC or DC, and output powers. By monitoring the PSU, the EMS calculates the power supply efficiency, detects efficiency degradation below a certain threshold, and detects power supply failure. The EMS communicates with a data center energy management (DCEM) server to give power supply efficiency and AC/DC power numbers reports, and receive configuration commands (for example the threshold levels), plus report alarms and errors. An EMS provides monitoring and reporting of PSU functionality. Various embodiments, below, show how the EMS may be functionality placed in a power supply powered device, a power supply unit, an intelligent power distribution unit, and the like, and thereby collect power related metrics and in some cases report PSU power related metrics and operational status to the DCEM server.

In a data center, where thousands of IT units are each fed by power from one or more PSUs, DCEM server software communicates with EMSs to keep track of the PSU efficiencies, and performs management tasks that improve the overall energy efficiency of the data center.

The illustrative embodiments permit a data center operator to migrate workloads in response to non-optimal shifts in operation of one or more power supplies of the data center. In addition, where a power supply operates at a power supply efficiency that suggests the power supply is failing or otherwise beyond an alarm threshold, embodiments may allow automatic ordering of inspections and/or maintenance for affected power supplies. Accordingly, the data processing system, or variations of it, may be configured to operate as a DCEM server, an intelligent power distribution unit (iPDU) controller, an IT equipment service processor, and/or power supply controller in a coordinated fashion.

Figure 4:
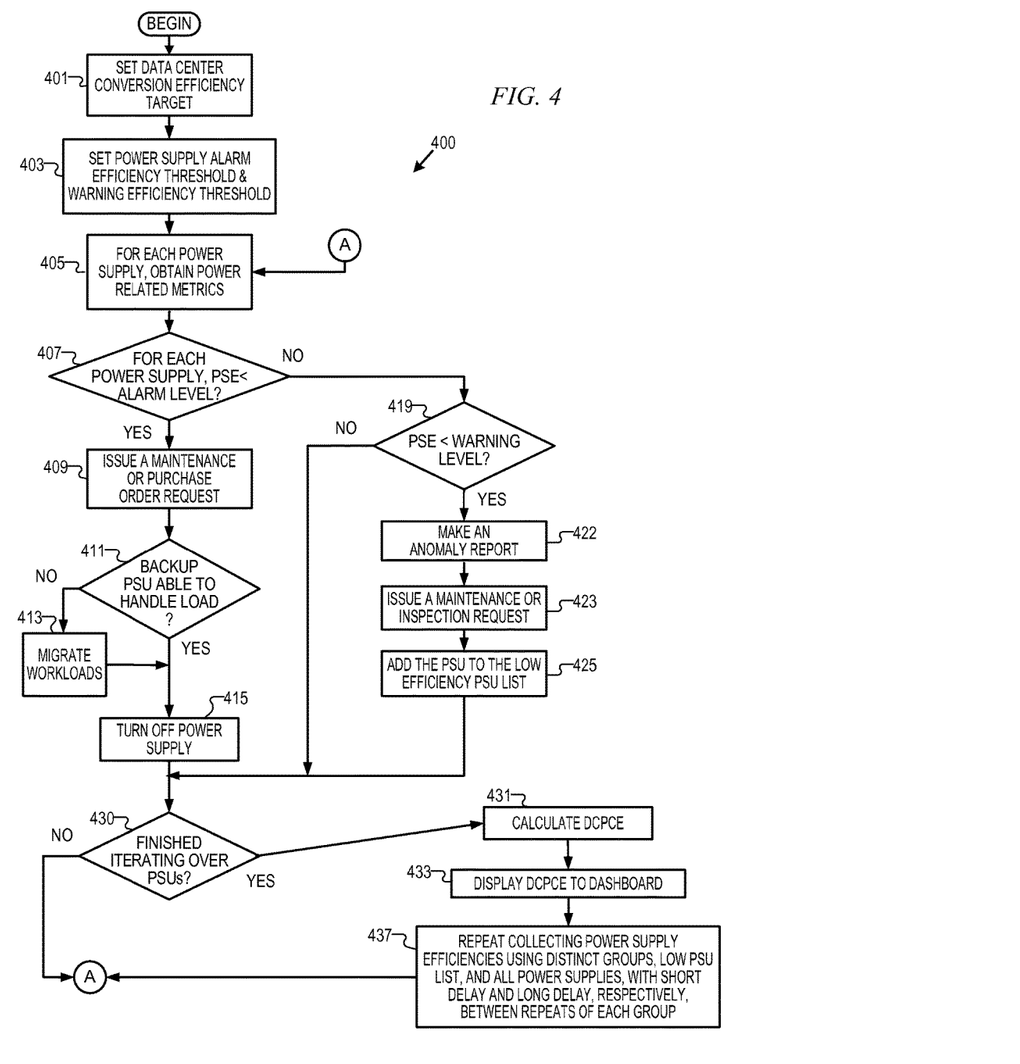
FIG. 4 is a flowchart of data center energy management (DCEM) server process in accordance with an illustrative embodiment of the invention.

The DCEM server may sum input AC power of power supplies to a total data center AC power. The total data center AC power is a sum of average AC power of each of a plurality of power supplies over a specific period. The average value of the power supply input AC power can be determined by sampling power supply input AC power over a period of time. The DCEM server sums output DC power of the power supply to a total DC power of the data center. The average value of the power supply input DC power can be determined by sampling power supply input DC power over a period of time. The DCEM server calculates a ratio of total AC power to total DC power to form data center power conversion efficiency. FIG. 4 explains this operation fully below The DCEM server can set an alarm level for each of the plurality of power supplies, wherein the alarm level is a power supply efficiency (PSE) threshold. The DCEM server sends PSE thresholds to the EMS of corresponding power supplies. The EMS may determine, on a scheduled basis, whether a real-time power efficiency level is below the power supply efficiency threshold. The PSE threshold may be based on one selected from the group consisting of temperature and loading. Temperature can be, for example, ambient temperature, which is the temperature of the air in a representative location near or inside the power supply. PSU loading can be a percentage of measured output power that IT devices are consuming from the output power rating of the PSU. The DCEM server, responsive to a determination that the real-time power efficiency level is below the PSE threshold, may remedy the power supply level. The remedy may occur in several different ways, including, for example, issuing maintenance request, issuing an inspection request, migrating workloads to backup power supplies, etc.

Figure 1B:
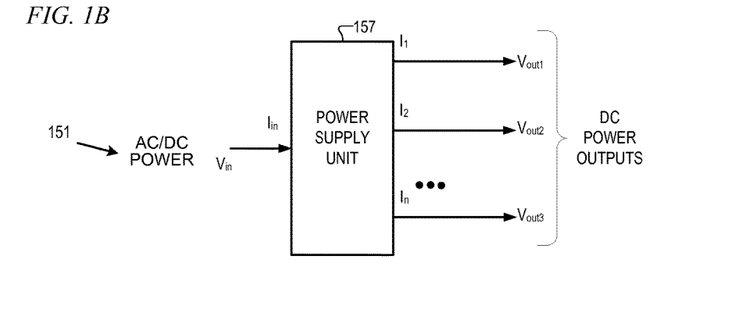
FIG. 1B is a block diagram of a power supply unit (PSU) in accordance with an illustrative embodiment of the invention.

FIG. 1B is a block diagram of a power supply unit (PSU) in accordance with an illustrative embodiment of the invention. Power supplies or PSUs are modules that convert AC power to DC power used by IT equipment, for example, data processing server, storage, and network system components. A PSU can regulate the signal to provide a stable DC signal at its outputs. Some power supplies incorporate batteries to provide uninterrupted power supply; such a power supplier is called an uninterruptible power supply (UPS).

Power supply unit (PSU) 157 receives AC (or DC) input 151 as, for example, a sinusoidal wave that is described by current, $I_{in}$, and a voltage, $V_{in}$. The root mean square (rms) value of the voltage and current AC's waveform ($V_{rms}$ and $I_{rms}$) are used to calculate the power consumption from an AC power line. For a DC voltage signal, the rms values of voltage and current signals are equal to the corresponding DC values. The average AC input power $P_{in}$ for the AC of PSU 157 is calculated as the product of apparent power ($V_{rms} \times I_{rms}$), and a power factor. The power factor is a positive value between 0 and 1, depending on the phase angle between current and voltage signals. The input phase angle ($\Phi$) is defined as the difference between the phases of the PSU input current waveform and the PSU input voltage waveform. For sinusoidal voltage and current waves, the power factor is calculated as $\cos(\Phi)$, and the real power is equal to $I_{rms} \times V_{rms} \times \cos(\Phi)$. For simplicity, in the rest of this document, real power will be referred to as 'AC power' or 'power'. For a pure resistive load, the power factor equals 1. In general, power factor is a fraction less than 1.

The PSU 157 provides a number, 'n', of DC outputs, each having a corresponding voltage value ($V_n$). Each of the IT equipment in a data center is supplied by DC power from one or more PSUs by means of two or more conductors connecting the output of PSU to IT equipment's power input pins. The supply current drawn from each of these outputs ($I_n$) depends on the load supplied by that output, which in general varies over time, based on the IT equipment's workload. A first DC output has current-voltage pair, $I_1$, $V_1$, respectively. A second DC output can have a current-voltage pair, $I_2$, $V_2$, respectively. A final DC output can have a current-voltage pair, $I_n$, $V_n$, respectively. A PSU may sum the DC power based on such current-voltage pairs to calculate a total output DC power of the power supply. The output power of a PSU with DC output is calculated as the product of $I_i$ and $V_i$.

PSU 157 may rely on an on-board microcontroller to perform the power and efficiency calculations, and report such calculations to a DCEM server using, for example, Ethernet, wireless, power line communications, or other communications means. The on-board microcontroller may run an instance of an energy management supervisor (EMS).

Figure 1C:
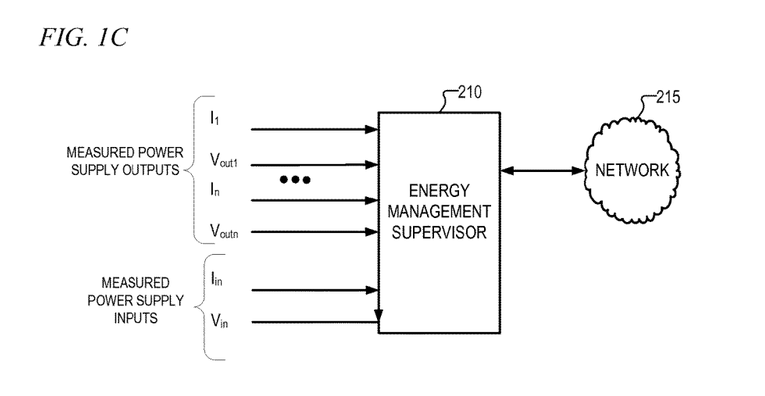
FIG. 1C is a block diagram of a software component called the energy management supervisor (EMS) in accordance with an illustrative embodiment of the invention.

FIG. 1C is a block diagram of an energy management supervisor (EMS), in accordance with an illustrative embodiment of the invention. An EMS is a software component that operates using the resources of a data processing system, which can be configured, for example, using a subset of components of a data processing system of FIG. 1A. EMS 210 monitors a single PSU or a small number of PSUs, to obtain input and output voltage and current measurements. The EMS may calculate power consumption and overall power supply efficiency. An EMS can be embedded in a monitored PSU, in an iPDU, or in IT equipment supplied by the PSU power. FIGS. 2A, 2B, 2C, and 2D present these different EMS embodiments.

Accordingly, EMS 210 is logically presented as relying on data inputs, $I_{in}$, $V_{in}$, $I_1$, $V_1$, $I_2$, $V_2$, . . . , $I_n$, and $V_n$, representing current and voltage measurements of corresponding power supply input and output parameters. Such values may be transported via network 215. It is appreciated that the EMS may perform its task in any unit where computing resources are available and to which currents and voltages are reported, either in analog or digital signals. Accordingly, the EMS can be resident within, for example, a PSU (e.g. FIG. 2A), a DC powered IT equipment, or an intelligent power distribution unit (iPDU).

An iPDU is a kind of power strip that includes an additional capability of communicating with IT equipment about current flowing through the iPDU. The iPDU can be rack-mounted, and more than one iPDU can be mounted in one rack. It takes as an input the AC power feeding the rack and distributes the AC to a plurality of outputs. Each output carries AC current to IT equipment mounted in the same rack. The iPDUs contain versatile sensors that provide power consumption information of the attached devices, and may also sense environmental information such as temperature and humidity. The iPDU's serial and LAN interfaces allow for remote monitoring and management through networked data processing systems. Networked data processing systems may be, for example, those that are executing a Web browser, any SNMP based Network Management System, Telnet, or a console.

Figure 2A:
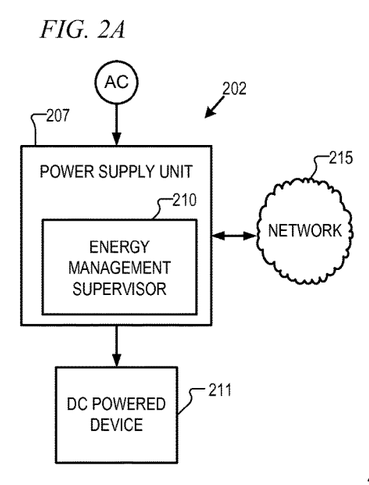
FIG. 2A is a first configuration of the EMS in accordance with an illustrative embodiment of the invention.

FIG. 2A is a first configuration 202 of the EMS in accordance with an illustrative embodiment of the invention. EMS 210 resides within PSU 207 to communicate with network 215, such as the EMS and network 215 of FIG. 1C. PSU 207 provides DC to DC powered device 211, which in turn, provides PSU input current, output current and voltage measurements to EMS 210. A DC powered device performs an information technology function. An information technology function can be storing or otherwise accessing data in non-volatile storage, communicating information according to a networking protocol, processing information in at least one processor core, and the like. Information technology equipment is equipment that is configured to perform at least one information technology function. The PSU, as configured in first configuration 202 may perform processes described in flowcharts described in FIGS. 6 and 7.

Figure 2B:
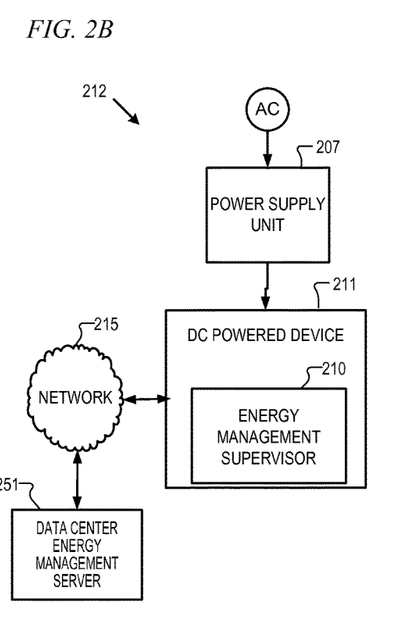
FIG. 2B is an alternative configuration of the EMS in accordance with an illustrative embodiment of the invention.

FIG. 2B is an alternative configuration 212 of the EMS in accordance with an illustrative embodiment of the invention. PSU 207 provides DC to DC powered device 211, which in turn, provides PSU input current, output current and voltage measurements to EMS 210. The EMS can measure the PSU output current and voltage measurements directly. However, in this case, the PSU input parameters are passed by the PSU to the EMS. EMS 210 reports PSU measurement and efficiency data via network 215 to the DCEM server 251.

IT equipment can be powered by more than one PSU in a redundant fashion for fault tolerance. If one or more redundant PSUs fails, then the IT equipment can continue to draw its current from another functioning PSU.

Figure 2C:
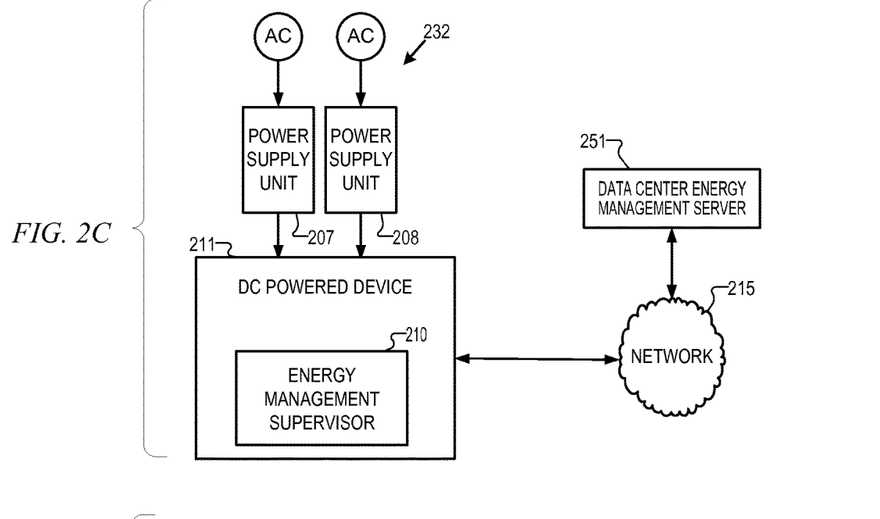
FIG. 2C is an alternative configuration of the EMS in accordance with an illustrative embodiment of the invention.

FIG. 2C is an alternative configuration 232 of the EMS in accordance with an illustrative embodiment of the invention with redundant power supply. PSUs 207 and 208 each provide DC power in a redundant fashion to DC powered device 211. EMS resides within DC powered device 211, and monitors all the PSUs feeding it simultaneously. EMS 210 reports its PSUs measurement and efficiency data via network 215 to DCEM server 251.

Figure 2D:
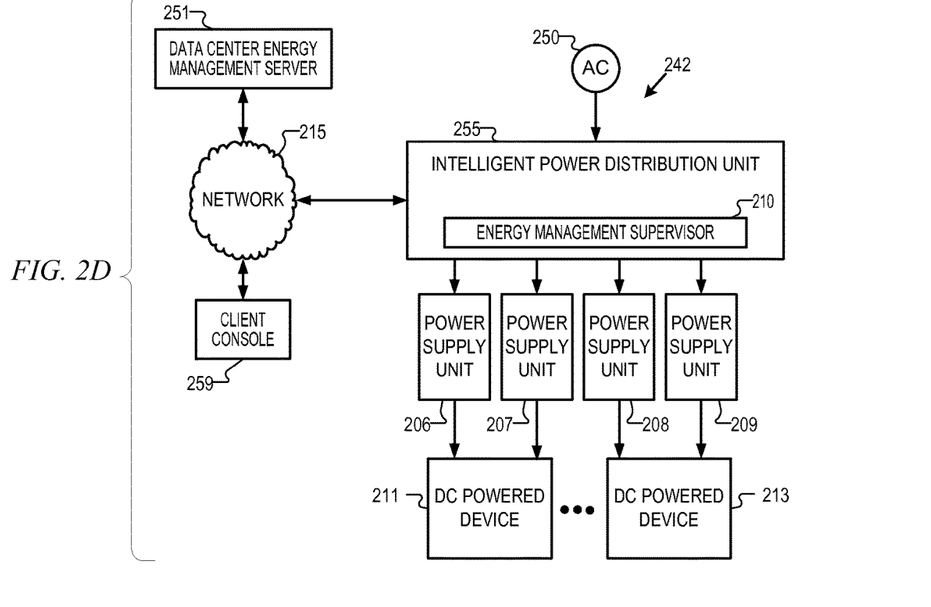
FIG. 2D is an alternative configuration of the EMS in accordance with an illustrative embodiment of the invention.

FIG. 2D is an alternative configuration 242 of the EMS in accordance with an illustrative embodiment of the invention. Data center level AC power is distributed to different racks inside the data center. Inside each rack, AC power 250 is distributed to rack mounted IT equipment by intelligent power distribution unit (iPDU) 255 feeding this equipment. Equipment can be fed by more than one iPDU. In this embodiment, iPDU 255 distributes AC to PSUs 206, 207, 208, and 209, which in turn provide DC power in a redundant fashion to DC powered devices 211 and 213. An iPDU can measure the AC current and voltage values consumed by each of the PSUs connected to it. Each PSU provides power to DC powered devices, and signals to the iPDU information concerning each DC power output. EMS 210, within iPDU 255, collects this information and provides it via network 215 to DCEM server 251. The iPDU information can be based on current (I) and voltage (V) signals collected from the PSUs connected to it. In this example the iPDU information can be a power supply efficiency, calculated from the AC power consumed by each PSU and the I and V signals at each corresponding PSU output. In addition, a client console 259 may operate to provide a user interface for control of DCEM server 251 as well as report current conditions of the data center. DCEM server 251 and client console 259 may be, for example, data processing system 100 of FIG. 1A.

An EMS, DCEM server or both may be configured to take action when a power supply degrades in performance, for example, in response to aging, environmental conditions, or electro-mechanical faults. Actions can be taken in response to power efficiency descending below levels or thresholds previously set. For example, An EMS can be configured to turn off a PSU with a degraded efficiency to prevent further deterioration, send an alarm to the DCEM server, or set a visual or audible alarm that corresponds to the severity of the alarm. The DCEM server can issue a maintenance or inspection order for the deteriorating PSU, a purchase order for a replacement PSU, and/or a workload migration command of workload running on the IT equipment powered by a failing PSU.

Figure 3A:
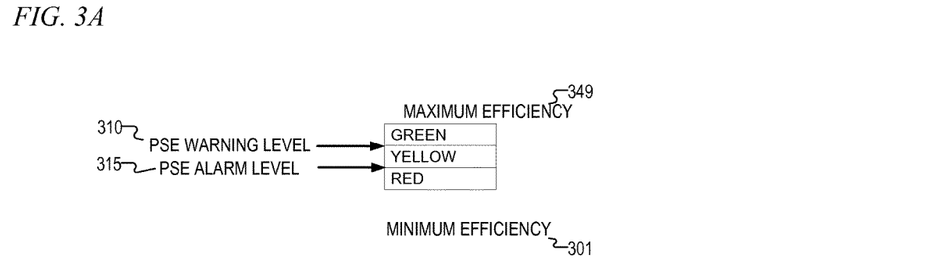
FIG. 3A is an initial configuration for alarm level and warning level in accordance with an illustrative embodiment of the invention.

FIG. 3A is an initial configuration for alarm level and warning level in accordance with an illustrative embodiment of the invention. Power supply efficiency is the ratio of the power arriving at an input to the power supply divided by the sum of all power at the outputs of the power supply. Accordingly, such a power supply efficiency can be represented as a percentage. A power supply efficiency threshold is a preset value that may be used as a basis for taking action when the power supply efficiency of a PSU descends below the threshold.

PSE thresholds may be, for example, a warning level, or an alarm level. A warning level is a threshold for a power supply, which may be specific to a temperature and power loading. When the PSU efficiency falls below these thresholds, a benefit accrues by acting to remedy the drop of efficiency, thereby reducing the wasted power conversion losses. An alarm level is a threshold for a power supply, which may be specific to a temperature and/or loading, that when penetrated below indicates a PSE that indicates assured benefits will result from changing/remedying the configuration. A warning level is a level of power supply efficiency higher or better than the alarm level.

The alarm level may be a preset power supply efficiency threshold. A preset power supply efficiency threshold may be a threshold set by a manufacturer, determined initially by testing newly installed PSUs, or provided by a system administrator of a data processing center.

A lower bound of the PSE can be minimum efficiency 301, which can be, for example, 0%, where the output power delivered to IT equipment is zero watts. An upper bound of the PSE can be maximum efficiency 349, which can be, for example, 100%, where the PSU output power is equal to the PSU input power, with no power loss. Status of a given power supply can be divided into three corresponding colors of red, yellow, and green, depending on what the current range is for the power supply efficiency.

Power supply efficiencies above PSE warning level 310 can be considered to be nominal, or green. Power supply efficiencies below PSE warning level 310 and above PSE alarm level 315 can be considered elevated, or yellow. Power supply efficiencies below PSE alarm level 315 can be considered critical, or red. A warning level can be uniformly set for all PSUs to match a goal set for the data center, in which they are located. Such a goal can be an system operator's preferred target for operating the data center. Accordingly, as explained below, an average PSE level of all PSUs in the data center falls below the goal the DCEM may show that the data center, as a whole, is not attaining the goal.

Alternatively, a more elaborate system of establishing thresholds or valid ranges may be used. One in which each PSU is assigned a table or matrix of thresholds or ranges that correspond to alarm and warning levels. In other words, the PSE alarm levels and PSE warning levels may be looked up from tables, as well as a from target data center power conversion efficiency (DCPCE). In one embodiment, these tables can be populated by the PSU manufacturer, based on the specific PSU design parameters, and PSU performance under different environmental and loading conditions. A warning level may be considered as a lower bound on the efficiency level of a PSU, below which a PSU is considered to have poor performance due to aging, for example. An alarm level may be considered as the manufacturer's indication of an abnormality of the PSU, which mandates a PSU maintenance or replacement by the maintenance technician. In another embodiment, these tables can be programmable after PSU installation in a data center to arbitrary values as illustrated in embodiments below.

Figure 3B:
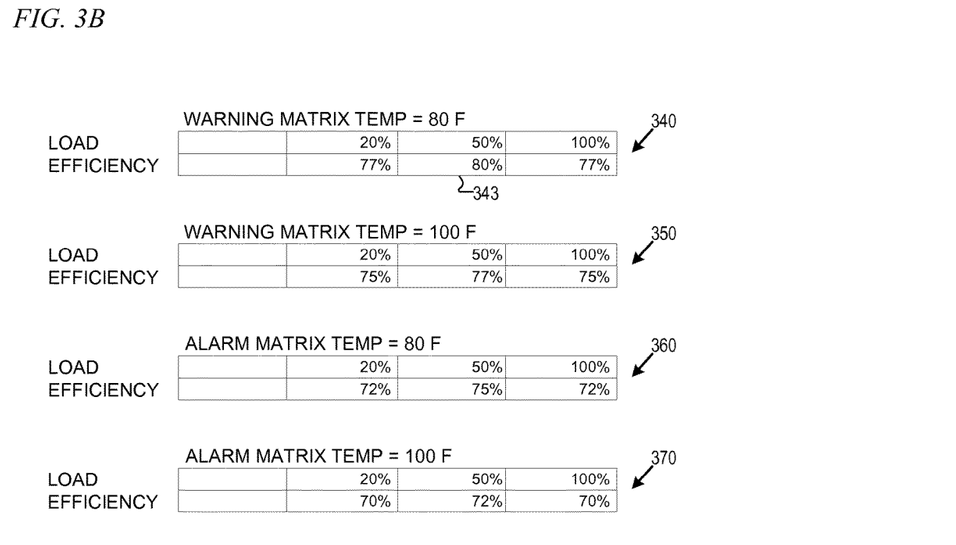
FIG. 3B is a table or matrix of matrix cells in accordance with an illustrative embodiment of the invention.

FIG. 3B is a table or matrix of cells in accordance with an illustrative embodiment of the invention. The matrix may store three values per combined temperature and loading ranges. Each such value may be a threshold, for example, for power supply efficiency. Load or loading is the proportion of the power supply's rated power that is being delivered to its outputs. Each matrix cell provides a target power efficiency, a PSE warning level and/or a PSE alarm level for a distinct range of temperature and loadings. An operator selected operational range is a range that relies on a value of the matrix as a lower or upper limit. For example, an operator selected operational range can be any power supply efficiency at or above 80%, in the case of matrix cell 343.

Matrix cells 340 are the warning levels for ranges of loading at temperatures above 80° F. Matrix cells 350 are the warning levels for ranges of loading at temperatures above 100° F.

Matrix cells 360 are the alarm levels for ranges of loading at temperatures above 80° F. Matrix cells 370 are the alarm levels for ranges of loading at temperatures above 100° F. Accordingly, by using multidimensional tables, a corresponding alarm level can be looked up for each combination of loading and temperature. Similarly, a corresponding alarm level can be added, either by the manufacturer, or the purchaser, such that an alarm level is set for each combination of loading and temperature.

FIG. 4 is a flowchart of data center energy management (DCEM) server process in accordance with an illustrative embodiment of the invention. One or more steps may be implemented dependent on an EMS action or by delegating processing of substeps to an EMS. A data center is the data processing systems and support systems at a geographic location. A data processing center can be built from, for example, a plurality of data processing systems 100 of FIG. 1A. Support systems may be, for example, network, storage, power, and cooling equipment.

Initially, in monitoring process 400, a DCEM server may set data center power conversion efficiency targets (step 401). The setting may be based on a user interaction via a terminal to fill values of matrix cells 320 and matrix cells 330, of FIG. 3B. The targets may include a DCPCE, which may establish an overall power conversion efficiency for all power supplies in the data center. Next, the DCEM server may set PSE thresholds (step 403). The PSE thresholds can be alarm levels and warning levels recorded to matrix cells

340, 350, 360, and 370. Step 403 may be performed iteratively for all power supplies in the data center. In addition, the thresholds can be based on specifications of the PSU according to its manufacturer. Accordingly, the DCEM server may configure power supplies in the data center by setting thresholds and other values within matrix cells.

A threshold is a one or more fixed values that are used to measure a relationship to one or more performance values of a PSU. Examples of types of fixed values can include, a temperature, a loading, a current, a voltage and a power supply efficiency for a power supply unit. Accordingly, a threshold for PSE can be coupled to a specific range of temperature or to a specific range of loading. As such, the PSE threshold applicable to a PSU is multidimensional. Many forms of tables can be created that create thresholds under different conditions. For example, a table of thresholds can be created for different ranges of output power, where a threshold is used to check whether input power is below a threshold looked-up on the basis of, for example, temperature, loading and input power. Furthermore, the input power can be a sum of the products of all input currents and input voltages. Accordingly, a threshold can be based on input currents, input voltages, output currents, and output voltages. Moreover, a threshold can be expressed in terms of power supply efficiency, current, and voltage.

Step 403 can include a phase where a PSU is operated at varying temperatures and loading, for example, shortly after PSU installation. During its initial power on, a PSU can measure, during a self test period, its own initial power supply efficiencies. The PSU determines the power supply levels by calculating a power supply efficiency. A power supply efficiency can be a power supply efficiency determined for a value of a variable load. A variable load is one or more circuits that draw power from a DC output of a power supply which may be turned on or off in order to change the power consumed. Variable loads can be a simple resistive load, a resistance-capacitance circuit load, or a general resistance-capacitance-inductance load. Alternatively, multi-core processors may be placed in-whole or in-part in a power saving mode to test the PSU under different load conditions. For example, the power supply efficiency can be based on a measured input current or an output current or an input voltage. A self test period is the time when a PSU is tested in varying configuration of, for example, loads placed on the PSU. In a different embodiment, a PSU can populate these tables with actual efficiencies during the self test period, based on actual environment and loading values. A loading value is a specific load placed on a power supply output. The loading value can be a percentage of a rated load for a power supply. A power supply output is any to which output the PSU delivers direct current.

Once the initial power supply efficiencies are determined, the PSU may establish operator-selected margin factors. Desired margin factors are thresholds or fractions of an initially determined operational capability, set to define either safe or energy efficient operation ranges. The desired margin factor can be defined by a range between a pair of thresholds, for examples, the PSU input voltage and the PSU output voltages. If the PSU measured input voltage is higher than the maximum PSU input voltage, an input overvoltage alarm message will be sent. The desired margin factor can alternatively be defined by a single threshold, for example, the phase angle between input current and input voltage ($\Phi$), and the input and output currents. If one PSU output current drawn from the power supply is larger than the maximum output current threshold, a PSU output over-current alarm message will be sent by the EMS. Another example is the calculated power supply efficiency, as determined during the self test period. If the PSU measured efficiency falls below the PSU efficiency threshold, a low efficiency PSU warning message may be sent by the EMS. Multiple desired operation factors can be configured for one parameter. For example, a warning level and an alarm level can be configured to trigger PSU efficiency deterioration levels at different levels of severity, as shown in FIG. 3A.

In a third embodiment, these tables can be populated at manufacturing time, and serve as a baseline for future reference. In other words, the values for a PSU can be stored to, for example, ROM, flash memory and the like, and be uploaded to a DCEM server promptly after initial use of the PSU in the data center. Accordingly, a temperature and a loading representative of the range of values to which a matrix cell corresponds may be tested, and the result used as a basis for setting a matrix cell. For example, a newly installed PSU can be determined to have a power supply efficiency of 84% when the temperature is 85° F. and loaded at a loading value of 60%. This power supply efficiency can be offset by, for example, 4% to provide a warning level, for example, of 80%, in matrix cell 343 of matrix 340 in FIG. 3B. Alternatively, a power supply efficiency threshold, establishing a warning level, can be set by applying a desired margin factor to the power supply efficiency determined during self test period. For example, a desired margin factor can be 95.2%. Accordingly, the warning level established for a power supply efficiency of 84% can be 84%×95.2%=80%. For example, a desired margin factor may be a factor used to multiply a power supply efficiency, as set at self test period, in order to obtain a resultant warning or error threshold.

Next, the DCEM server may obtain power related metrics for each power supply on an iterative basis (step 405). A power related metric is a value that may be measured or calculated with respect to a power supply unit concerning current. A power related metric may be, for example, input current ($I_{in}$), output current ($I_{out}$), input voltage ($V_{in}$), output voltage ($V_{out}$), input power, output power, phase angles of the AC, or power supply efficiency. Each such power related metric may have a corresponding operator-selected operational range. Among the power related metrics, the DCEM server may obtain, for example, power supply efficiencies (PSE) for each power supply at step 405. Step 405 may iterate over the entire set of power supplies in the data center. Alternatively, step 405 may allow the DCEM server to iterate over a subset of the data center power supplies, namely, those placed in a low efficiency power supply unit (PSU) list, explained below. First, the DCEM server may request an EMS to calculate a real-time input AC power of a PSU. Second, the DCEM server may request an EMS to calculate a sum of all output DC powers at the PSU outputs. Third, the DCEM server may request the EMS to calculate the PSU efficiency, and the EMS may compute the real-time power efficiency level (PSE) as the ratio of the sum of output DC powers divided by the real-time input AC power. Finally, the EMS may obtain temperature and loading information for the PSU, for example, based on sensors placed in or near the PSU. Thus, the EMS may look up the warning and alarm levels that correspond to run-time temperature and loading values, and forward them to the DCEM along with the run time PSU efficiency.

Alternatively, the average values of all these parameters can be tracked by the EMS over a period of time, as specified by the DCEM server. Accordingly, a single value for each parameter over the period can be sent back to the DCEM server, rather than an instantaneous value at the time this information is requested.

Next, the DCEM may determine for each power supply, whether a power related metric is outside of a range, or otherwise exceeds a threshold. For example, the DCEM may determine whether the PSE level (real-time or averaged) is below a corresponding alarm level of the power supply (step 407). Such a determination may be based on the temperature and loading of the power supply. Alternatively, this determination is done by the DCEM server, based on the loading, environmental, and loading information collected for each PSU.

Each determination involves the DCEM server and/or EMS performing a number of substeps.

A positive determination at step 407 may cause the DCEM server to take remedial action. In other words, responsive to a determination that the real-time power efficiency level is below the PSE threshold, the DCEM server may remedy the power supply. For example, the DCEM server may issue a maintenance request or purchase order request (step 409) as a form of remedy. The maintenance request may result in a purchase order request for a replacement power supply. A replacement power supply is a power supply that provides at least as much DC power output as the power supply compared at step 407 and found to be underperforming. Next, if the PSU inspected in step 407 has a redundant backup PSU, the DCEM server and/or the EMS may determine whether the backup PSU is able to handle a load of the power supply (step 411). The backup power supply is an alternative power supply that can supply power to a data processing system having sufficient resources to execute the processes and/or applications that are supported by the power supply that triggered a negative determination at step 407. An application may be a thread, a process, a virtual machine, or other stream of computer instructions that is routinely executed on a processor.

Provided the DCEM server makes a negative determination in step 411, the DCEM server may migrate workloads of a data processing system that depend on the affected PSU to another data processing system that does not depend on the affected PSU (step 413). A workload is a running process or application of a data processing system. Accordingly, such an application or applications that are dependent on the affected power supply can be migrated to a data processing system not dependent on the power supply.

Next, or following a positive determination at step 411, the DCEM server may turn off the power supply (step 415), and continue to step 430, explained below.

A negative determination at step 407 can result in the DCEM server determining whether the PSE of the power supply is less than the corresponding warning level (step 419). Step 419 can involve the DCEM server looking up the appropriate warning level from a matrix based on temperature and loading of the power supply. Steps 407 and 419 can be used to determine, on a scheduled basis, that a real-time power efficiency level is below a corresponding power supply efficiency threshold. The scheduled basis is a period or time set based on delays or periods set in, for example, step 437, explained further below.

In response to a positive determination, the DCEM server may make an anomaly report (step 422). An anomaly report can be a warning message or an alarm message. A message can be a message transmitted from the machine. The message can be asynchronously transmitted, or it may be sent in response to a user query, for example, as when reviewing a log rendered in HTML.

Further actions may be taken in response to the DCEM determining the PSE value is outside of a range. For example, the DCEM may issue a maintenance or inspection request (step 423). Steps 409 and 423 can involve the DCEM server transmitting an email to a designated entity, such as a technician, or a vendor to indicate a required remedy as well as describe the affected PSU. The emails can include, for example, a) maintenance text in the language of the entity; or b) a purchase order in the language of the entity in the case of step 409. Similarly, the email can include, for example, a) language concerning maintenance, or b) inspection, in the case of step 423. Further details can be given, such as, for example, the address of the data center, the age and history of the affected power supply, as well as any other information deemed useful to service the power supply. Alternatively, the DCEM can report an anomaly report, such as an alarm message or a warning message.

Next, the DCEM server may add the PSU to a low efficiency PSU list (step 425). A low efficiency PSU list is a list that includes power supplies that are operating below warning level PSEs for some temperature and/or loading configurations of the power supply. The list can be stored to disk in a data structure that can be reviewed by service personnel and updated in response to service calls. The low PSU list, or low efficiency PSU list, is a subset of all PSUs that are to be monitored on a more frequent basis than the PSUs generally. Accordingly, iterations through steps of monitoring process 400 may occur on a short delay with respect to a PSU in the low PSU list, while a long delay may apply to the period between monitoring (executing step 405) the group of all PSUs.

Accordingly, a next step can be that the DCEM server associates the low PSU list, and in particular, the PSU that triggers the warning level, to a short delay.

Next, the DCEM server may determine whether it has finished iterating over PSUs (step 430). Step 430 may be executed in response to a negative determination at steps 411 or 419. Step 430 is performed with respect to the group of PSUs that are to be monitored together. In other words, the group can be either the low PSU list, or the entire group of PSUs at the data center. If further PSUs remain to monitor, a negative branch of step 430 is performed, and processing resumes at step 405 for the balance of the PSUs in the group.

Figure 5:
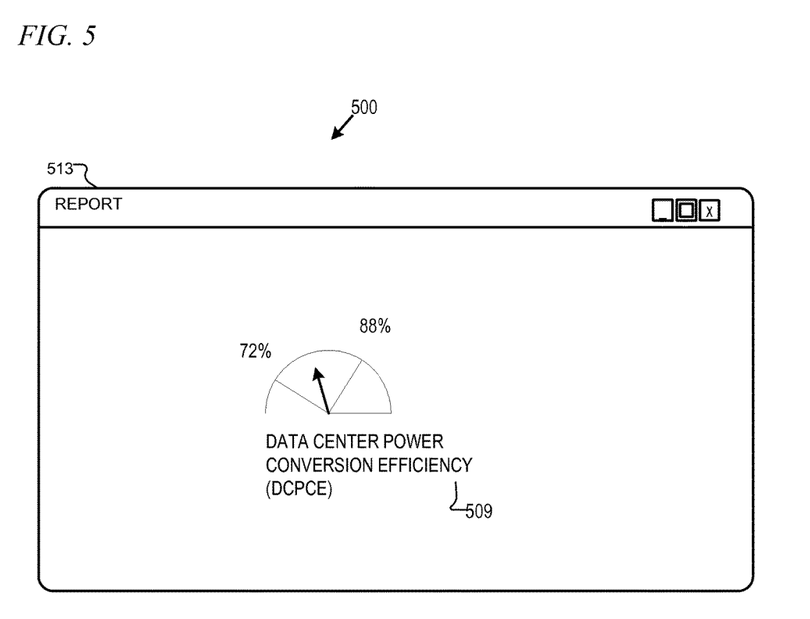
FIG. 5 is a dashboard to present a data center power conversion efficiency in accordance with an illustrative embodiment of the invention.

However, a positive determination at step 430 can trigger activity reportable to a user or administrator of the data center. Accordingly, the DCEM server may cause the DCEM server to calculate a DCPCE (step 431). The DCPCE can be a ratio of total AC power to total DC power. Such a report may be made by displaying the DCPCE to a dashboard (step 433). FIG. 5, below, illustrates an example of a dashboard. Since the status of power supplies is to be monitored routinely, but more frequently for those that are in the low PSU list, process 400 is re-executed depending on the time elapsed for either the group of PSUs in the low PSU list, or for all PSUs. Accordingly, the DCEM server repeats collecting power supply efficiencies using distinct groups, namely, a low PSU list group and a group of all PSUs (step 437). As such, the low PSU list is delayed with a short delay before monitoring step 405 resumes iterating. In contrast, the entire group of PSUs is iterated based on a long delay, relative to the low PSU list. As can be appreciated, displaying the data center power conversion efficiency to a dashboard can include responding to an HTTP request of an authorized client, and rendering the dashboard in a responsive HTTP response to the request.

The DCEM server totals DC power and a totals AC power, using the total AC power of the data center and replacing a previous input AC power of the power supply with a real-time input AC power of the power supply. Similarly, the DCEM server may use the total DC power of the data center and replace a previous or recent DC power of the power supply with a real-time DC power of the power supplies outputs. A real-time input alternating power of the power supply is the most recently measured AC power. Such a real-time input alternating power may be measured and/or calculated at step 405, above. A real-time DC power of the power supply is the most recently measured DC power measured from all outputs of the power supply. These real-time values may be either instantaneous or average current and voltage values measured over a sampling period.

Accordingly, the power supply efficiency may calculated using the total average value of measured input AC power and the average value of measured output DC power, over an arbitrary period of time.

Next, the DCEM server may report a ratio of total AC power to total DC power as DCPCE. Such a report may be made by displaying the DCPCE to a dashboard (step 433). FIG. 5, below, illustrates an example of a dashboard. Next, the DCEM server may wait an extended time before rechecking power supplies to get power supply efficiencies for the next iteration after an arbitrary period of time. The extended time can be a duration on the order of an hour or more. After repeatedly collecting PSE thresholds using distinct groups, low PSU lists, and all power supplies, with short delays and long delays, respectively, between repeats of each group (step 437), the DCEM server may resume obtaining PSE thresholds and input powers at step 405.

In relation to FIG. 2A, a power supply unit may respond to the steps in the flowchart of monitoring process 400, when, for example, those steps are performed by the DCEM server. Such a PSU may rely on an EMS to receive and store power supply efficiency thresholds on a factory assembly line, that is, based on the manufacturer's values. The EMS may, once installed to a data center, receive a query for a PSE threshold from the DCEM server, for example, responsive to step 405. Further responsive to step 405, the EMS of the power supply unit may transmit the PSE thresholds to the DCEM server.

Further processing at the power supply unit may include receiving a query for real-time PSE, from, for example, the DCEM server. Similarly, in response to such a query, the PSU may transmit the real-time PSE level. The power supply may be repeatedly queried and provide repeated responses, driven by interaction with the DCEM server performing process of monitoring process 400. A query for a PSE threshold may be a packet received to a communication unit of the PSU, where the packet has a preset code recognized at the PSU as a request for PSE thresholds. Similarly, the query for a real-time PSE level, can be a packet with a code preset, by convention, to a code that is registered at the PSU to indicate a request for the real-time PSE level. In each query, the packet may include an Internet Protocol (IP) address or other unique address corresponding to the PSU. Such a packet can also have an IP address that corresponds to the source for the packet. The source can be, for example, the DCEM server.

FIG. 5 is a dashboard to present a data center power conversion efficiency in accordance with an illustrative embodiment of the invention. Dashboard 500 may include a report 513, which shows, for example, by way of a meter, a current data center power conversion efficiency measured for the data center. In particular, dashboard 500 may show the data center power conversion efficiency target 509.

In another embodiment, the dashboard can show history of DCPCE values over previous sampling times. The dashboard can also show PSU efficiency of groups of power supplies. Power supplies may be grouped based on PSU manufacturer, load value, IT equipment class, etc. The dashboard can have pointers to low efficiency PSU list, high efficiency list, etc. Another alternative is to group PSUs according to the owning line of business, PSU age, and PSU load value.

Figure 6:
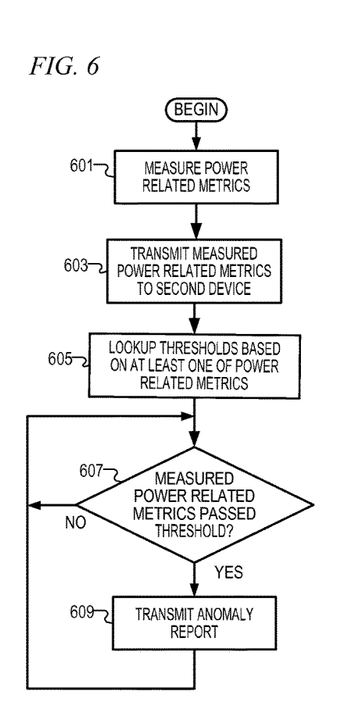
FIG. 6 is a flowchart of a PSU embodiment in accordance with an illustrative embodiment of the invention.

FIG. 6 is a flowchart of a PSU embodiment in accordance with an illustrative embodiment of the invention. The PSU may have an embedded EMS operating according to PSU 210 in FIG. 2A, above. The PSU may receive inputs and queries from a DCEM, and correspondingly report alarms, warnings and other anomalies to a DCEM, either directly or indirectly. Initially, the PSU may measure power related metrics (step 601). This step can involve measuring $I_{in}$, $I_{out}$, $V_{out}$ and $V_{in}$ to form measured $I_{in}$, $I_{out}$, $V_{in}$ and $V_{out}$. $I_{in}$ and may be expressed as a root mean square (RMS) value for the oscillating current. Next, the PSU may transmit measured power related metrics to a second device (step 603). The second device can be, for example, a DCEM. Furthermore, the transmission of such information may be in response to receiving a query from the second device.

Next, the PSU may lookup thresholds based on at least one of the power related metrics (step 605). As explained above, especially FIG. 3B, the looking-up can be additionally based on temperature and loading of the PSU. Next, the PSU may determine if the measured power related metrics have passed a threshold (step 607). This determination can be a determination that the compared value is above, below, or between thresholds. The threshold can be a power supply efficiency threshold or a threshold that is related to the power supply efficiency.

Next, provided a positive result occurs at step 607, the PSU may transmit an anomaly report (step 609). An anomaly report can be a warning or an alarm. A negative determination can cause the PSU to repeatedly execute step 607. Following each report, the PSU may repeatedly test the thresholds be re-executing step 607.

Figure 7:
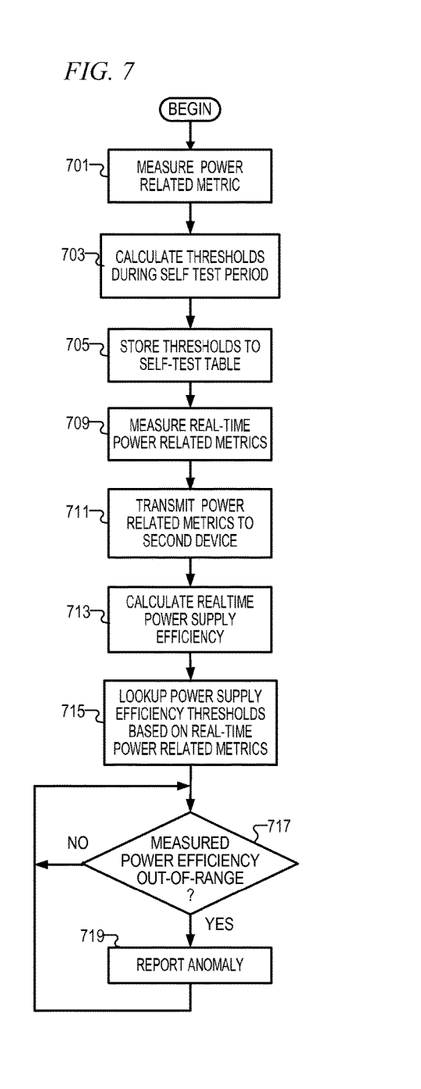
FIG. 7 is a flowchart of a PSU embodiment in accordance with an alternative illustrative embodiment of the invention.

FIG. 7 is a flowchart of a PSU embodiment in accordance with an alternative illustrative embodiment of the invention. The PSU may have an embedded EMS operating according to the configuration described in FIG. 2A, above. The PSU may receive inputs and queries from a DCEM, and correspondingly report alarms, warnings and other anomalies to a DCEM, either directly or indirectly.

Initially, the PSU may measure power related metrics to form measured power related metrics (step 701). This step can involve measuring $I_{in}$, $I_{out}$, $V_{out}$ and $V_{in}$ to form measured $I_{in}$, $I_{out}$, $V_{in}$ and $V_{out}$. These measurements may be performed periodically or during a self test period. A self test period is the initial period of operating a PSU, in which a variable load is applied to each of the PSU output pins to test the PSU efficiency under different loading conditions. Actual production data can be developed from the PSU to fill a built-in table with, for example, values for the tables in FIG. 3B. Measurements may be sampled over time and averaged for combinations of temperature and loading. This step can be carried out by the PSU iterating over a range of temperatures and then over a range of loads, sampling at each stage the power supply efficiency of the PSU, as described above. Accordingly, once sampling is completed, the PSU may calculate thresholds during the self test period (step 703). The calculation can include averaging the values sampled during a self test period. Furthermore, having established nominal operating efficiencies, the PSU may set-off from such calculated averages, margins. These margins can be applied to the alarm threshold and warning threshold, for example, 80% nominal power supply efficiency, and 90% nominal power efficiency, respectively, for each determined average. In other words, the thresholds are set such that the initial PSEs for a PSU are well above the warning threshold and alarm threshold.

Next, the PSU may store the thresholds to the built-in table (step 705). A built-in table is the memory and data stored therein based on established thresholds for reporting anomalies, such as, warnings and alarms. At this point, the PSU may be monitored in a mode where actual warnings or alarms can be detected and reported. Accordingly, the PSU may measure real-time power related metrics (step 709). Among the real-time power related metrics, the PSU may measure a real-time $I_{in}$. Real-time $I_{in}$ is a current or sum of currents input to the PSU that is sampled routinely at intervals short enough to permit monitoring most degradation in power supply efficiency performance. Similarly, a real-time value for each power related metric, such as, $I_{out}$, $V_{out}$ and $V_{in}$ is the sampled measurement of each of these quantities for the entire PSU.

Next, the PSU may transmit the $I_{in}$ and other real-time values as power related metrics to a second device (step 711). Then, the PSU may calculate real-time power supply efficiency to form real-time power supply efficiency based on these values (step 713). Next, the PSU may lookup power supply efficiency thresholds based on at least one of real-time power related metrics (step 715). The power supply efficiency thresholds can be looked up based on, for example, real-time $I_{in}$. Alternatively, the power supply efficiency threshold can be looked up based on, for example $I_{out}$ and $V_{out}$.

Subsequently, the PSU may determine if the measured power supply efficiency is out of range (step 717). If the measured power supply efficiency is out of range the PSU may report an anomaly (step 719). The anomaly report can be a warning sent to a second device.

Some embodiments may hold the anomaly reports or transmittals of real-time values in steps 711 and/or 719 until a request or query of the PSU is made by a second device. Accordingly, prior to step 719, the PSU may receive a query for real-time power supply efficiency. A query for real-time power supply efficiency is a request made to the PSU by a DCEM or an intermediary device. The query for real-time power supply efficiency can be made using a networking protocol, including those that involve placing a carrier on conductors that also supply DC power. Responsive to such a query, the PSU may report the real-time power supply efficiency to the source for the query.

Figure 8:
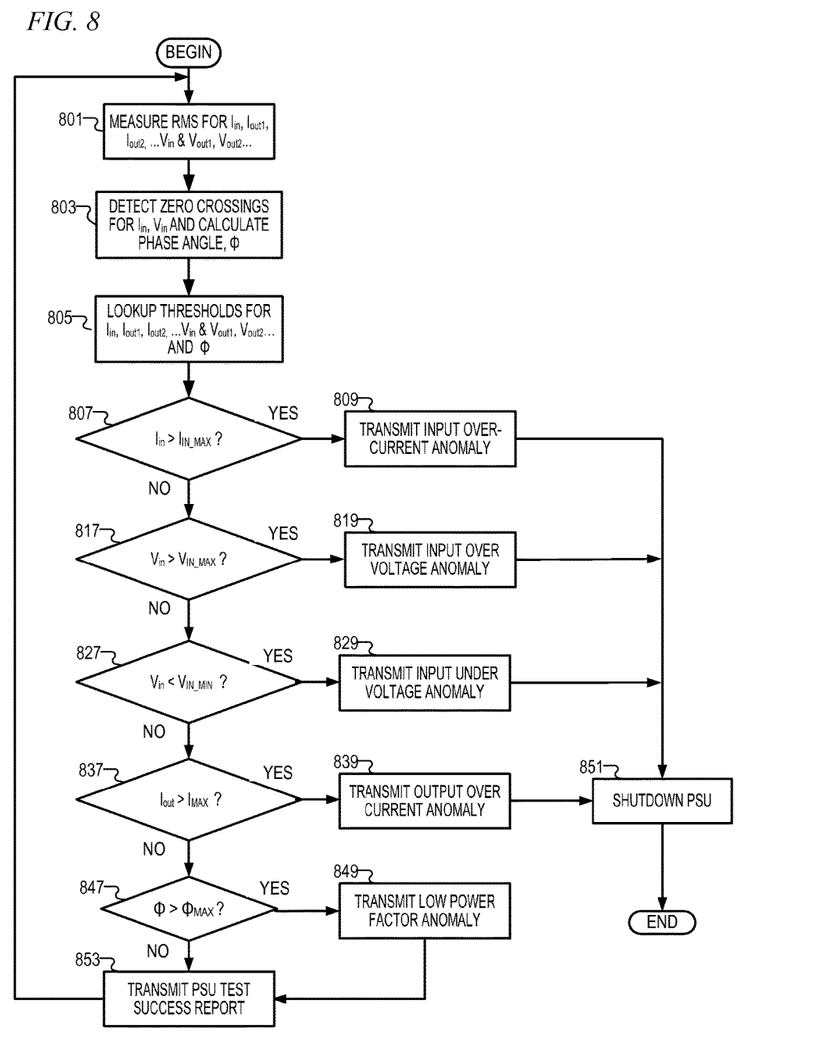
FIG. 8 is a flowchart of an alternative process to transmit anomalies concerning power related metrics in accordance with an illustrative embodiment of the invention.

FIG. 8 is a flowchart of an alternative process to transmit anomalies concerning power related metrics in accordance with an illustrative embodiment of the invention. Initially, a PSU may measure a root mean squared (RMS) value for at least $I_{in}$ and $V_{in}$ as well as $V_{out}$ for each output and $I_{out}$ for each output (step 801). Next the PSU may determine a phase angle for $I_{in}$ and $V_{in}$ (step 803). The phase angle can be determined by detecting the zero crossing for the $I_{in}$, the zero crossing for $V_{in}$ and measuring the phase angle between such zero crossings. In other words, phase angle, $\Phi=\Delta \times 2\Pi \times Freq$, where $\Delta$ is the difference between the zero crossings time of the $V_{in}$ as compared to $I_{in}$, and Freq is the frequency of the AC signals $V_{in}$ and $I_{in}$, usually 60 Hz or 50 Hz.

Next, the PSU may lookup the applicable thresholds for each of $I_{in}$, $I_{out1}$ through $I_{outn}$ (where n is the number of outputs), $V_{in}$, $V_{out1}$ through $V_{outn}$, and phase angle of the input voltage and current (step 805).

The PSU may determine whether the $I_{in}$ is greater than a threshold for $I_{in}$, $I_{in\_max}$ (step 807). A positive determination may result in the PSU transmitting an input over-current anomaly (step 809). The input over-current anomaly is a signal that may identify the affected PSU and use a predetermined constant to signal that an over-current has occurred at the PSU.

Next, responsive to a negative determination at step 807 the PSU may determine whether the $V_{in}$ is greater than a voltage input threshold, $V_{in\_max}$ (step 817). A positive determination may cause the PSU to transmit an input over voltage anomaly (step 819).

Next, responsive to a negative determination at step 817, the PSU may determine if $V_{in}$ is less than a minimum input voltage threshold, $V_{in\_mm}$ (step 827). A positive determination at step 827 may cause the PSU to transmit an input under voltage anomaly (step 829).

Next, responsive to a negative determination at step 827, the PSU may determine whether $I_{out}$ is greater than a maximum threshold, $I_{out\_max}$ (step 837). A positive determination may cause the PSU to transmit an output over current anomaly (step 839). Following steps 809, 819, 829, 839, the PSU may shut itself down (step 851).

However, a negative determination at step 837 may cause the PSU to determine whether the phase angle exceeds a maximum phase angle, $\Phi_{max}$ (step 847). A positive determination may cause the PSU to transmit a low power factor anomaly (step 849).

After a negative determination to step 847 and after step 849, the PSU may transmit a PSU test success report (step 853). Thereafter, the PSU may repeat step 801 and subsequent steps for different values of the variable load.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable storage device providing program code for use by or in connection with a computer or any instruction execution system. For the purposes of this description, a computer-usable or computer readable storage device can be any tangible apparatus that can store the program for use by or in connection with the instruction execution system, apparatus, or device.

The computer-readable storage device can be an electronic, magnetic, optical, electromagnetic, or semiconductor system (or apparatus or device). Examples of a computer-readable storage device include a semiconductor or solid state memory, magnetic tape, a removable computer diskette, a random access memory (RAM), a read-only memory (ROM), or a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor or a microcontroller coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for reporting and controlling power efficiency information and power efficiency of a data center, the method comprising:
   receiving, by a supervisor computer, a query for real-time power supply efficiency information from a server;
   querying, by the supervisor computer, each power supply unit of a plurality of power supply units in the data center for at least one selected from the group consisting of temperature, input current, input voltage, output current, output voltage, wherein querying comprises transmitting a packet with a preset code to each power supply unit and wherein
   each power supply unit detecting the preset code, and in response, performing a respective self-test during a self-test period to obtain measurements of measuring itself for at least one selected from the group consisting of input current, input voltage, output current, output voltage of itself;
   formulating, by the supervisory computer, a multidimensional matrix table for each power supply unit by performing the respective self-tests and by measuring and averaging measurements of the at least one of input current, input voltage, output current, and output voltage over a period of time for each power supply unit at varying configurations of loading and varying ranges of temperature to populate the multidimensional matrix table with thresholds under different working conditions for each power supply unit, wherein the table provides corresponding threshold levels of at least one of warning and alarm level for a distinct range of temperatures and loadings of the power supply unit such that the threshold levels are used to measure a relationship to one or more performance values of the power supply unit;
   calculating, by the supervisor computer, for each power supply unit, the power supply efficiency as a performance value, and determining that a power supply efficiency of a first power supply unit is below a warning threshold level obtained from the multidimensional table for the first power supply unit, and in response, assigning the first power supply unit to a low power supply list, and at least one second one power supply unit is not assigned to the low power supply list in response to determining that a power supply efficiency of the at least one second power supply unit is not below the warning threshold level obtained from the multidimensional table for the second power supply unit;
   re-iterating querying by the supervisor computer, each power supply unit assigned to the low power supply list for at least one selected from the group consisting of input current, input voltage, output current, output voltage, wherein re-iterating querying comprises transmitting a packet with the preset code to each power supply unit assigned to a low power supply list, wherein, the at least one second power supply unit is queried at an interval longer than an interval for the first power supply unit such that iterations through steps of monitoring of a power supply unit occur on a short delay with respect to a power supply unit in the low power supply unit list, while a long delay applies to the period between monitoring the plurality of power supply units; and
   in response to further re-iterating the querying and in response to determining that the power supply efficiency is below an alarm threshold, wherein the alarm threshold is below the warning threshold level and in response, turning off the first power supply unit and migrating workloads of a data processing system that depends on the first power supply to another data processing system that does not depend on the first power supply and to thereby increasing power efficiency among the plurality of power supply units of the data center and increase overall efficiency of the data center, wherein the alarm threshold is below the warning threshold.

2. The computer implemented method of claim 1, further comprising:
   receiving direct current at an input; and
   providing an information technology function.

3. The computer implemented method of claim 1, wherein transmitting the packet comprises transmitting a packet addressed to an Internet protocol address.

* * * * *